US010571487B2

(12) United States Patent
Bock et al.

(10) Patent No.: US 10,571,487 B2
(45) Date of Patent: Feb. 25, 2020

(54) CONTACT ENGINES, PROBE HEAD ASSEMBLIES, PROBE SYSTEMS, AND ASSOCIATED METHODS FOR ON-WAFER TESTING OF THE WIRELESS OPERATION OF A DEVICE UNDER TEST

(71) Applicant: Cascade Microtech, Inc., Beaverton, OR (US)

(72) Inventors: Daniel Mark Bock, Portland, OR (US); Tim Cleary, Portland, OR (US)

(73) Assignee: FormFactor Beaverton, Inc., Beaverton, OR (US)

( * ) Notice: Subject to any disclaimer, the term of this patent is extended or adjusted under 35 U.S.C. 154(b) by 0 days.

(21) Appl. No.: 15/821,101

(22) Filed: Nov. 22, 2017

(65) Prior Publication Data

US 2018/0149674 A1    May 31, 2018

Related U.S. Application Data

(60) Provisional application No. 62/428,297, filed on Nov. 30, 2016.

(51) Int. Cl.
*G01R 1/073* (2006.01)
*G01R 31/302* (2006.01)

(52) U.S. Cl.
CPC ....... *G01R 1/0735* (2013.01); *G01R 31/3025* (2013.01)

(58) Field of Classification Search
CPC ........................... G01R 1/0735; G01R 31/3025
See application file for complete search history.

(56) References Cited

U.S. PATENT DOCUMENTS 5,631,572 A * 5/1997 Sheen ................. G01R 31/046
                                                                324/754.08
5,983,363 A   11/1999 Tuttle et al.
(Continued)

FOREIGN PATENT DOCUMENTS

DE         3908846 A1 * 11/1989 ......... G01R 29/0878

OTHER PUBLICATIONS

Finkenzeller, Klaus. RFID Handbook: Fundamentals and Applications in Contactless Smart Cards and Identification. England: John Wiley & Sons, Ltd., 2003, Second Edition.

*Primary Examiner* — Walter L Lindsay, Jr.
*Assistant Examiner* — Milton Gonzalez
(74) *Attorney, Agent, or Firm* — Dascenzo Intellectual Property Law, P.C.

(57) ABSTRACT

Contact engines, probe head assemblies, probe systems, and associated methods for on-wafer testing of the wireless operation of a device under test (DUT). A contact engine includes a flexible dielectric membrane having a first surface and a second surface and a plurality of probes supported by the flexible dielectric membrane. The plurality of probes are oriented to contact a plurality of contact locations on the DUT. Each probe in the plurality of probes includes a corresponding probe tip that projects from the second surface of the flexible dielectric membrane and is configured to electrically and physically contact a corresponding contact location of the plurality of contact locations. The contact engine further includes at least one membrane antenna supported by the flexible dielectric membrane. A probe head assembly includes the contact engine. A probe system includes the probe head assembly. Associated methods include methods of utilizing the contact engine.

31 Claims, 9 Drawing Sheets

(56) References Cited

U.S. PATENT DOCUMENTS

| | | | |
|---|---|---|---|
| 6,058,497 A * | 5/2000 | Tuttle | G01R 31/01 |
| | | | 714/30 |
| 6,842,606 B1 | 1/2005 | Takemura | |
| 7,388,388 B2 * | 6/2008 | Dong | G01R 1/07314 |
| | | | 324/754.07 |
| 7,768,790 B2 | 8/2010 | Kuroda et al. | |
| 8,090,414 B2 | 1/2012 | Mickle et al. | |
| 8,319,474 B2 | 11/2012 | Mitake et al. | |
| 8,351,982 B2 | 1/2013 | Rofougaran | |
| 8,364,195 B2 | 1/2013 | Spina et al. | |
| 8,872,384 B2 | 10/2014 | Stratakos et al. | |
| 9,188,635 B2 * | 11/2015 | Pagani | G01R 31/2889 |
| 2003/0146879 A1 | 8/2003 | Anderson | |
| 2005/0068019 A1 | 3/2005 | Nakamura et al. | |
| 2005/0245291 A1 | 11/2005 | Brown et al. | |
| 2007/0064406 A1 | 3/2007 | Beart | |
| 2009/0033467 A1 | 2/2009 | Finocchiaro et al. | |
| 2009/0157145 A1 | 6/2009 | Cauller | |
| 2009/0289869 A1 | 11/2009 | Babakhani et al. | |
| 2010/0021176 A1 | 1/2010 | Holcombe et al. | |
| 2010/0148723 A1 | 6/2010 | Cook et al. | |
| 2010/0181841 A1 | 7/2010 | Azancot et al. | |
| 2010/0214177 A1 | 8/2010 | Parsche | |
| 2011/0043050 A1 | 2/2011 | Yabe et al. | |
| 2011/0074341 A1 | 3/2011 | Jensen et al. | |
| 2011/0084887 A1 | 4/2011 | Mow et al. | |
| 2011/0127845 A1 | 6/2011 | Walley et al. | |
| 2011/0130093 A1 | 6/2011 | Walley et al. | |
| 2011/0186368 A1 | 8/2011 | Ueno et al. | |
| 2011/0266344 A1 | 11/2011 | Tan et al. | |
| 2012/0086612 A1 | 4/2012 | Linehan et al. | |
| 2012/0091211 A1 | 4/2012 | Kuroda | |
| 2012/0153740 A1 | 6/2012 | Soar | |
| 2012/0239339 A1 | 9/2012 | Kaneko et al. | |
| 2012/0286817 A1 * | 11/2012 | Duckworth | G01R 1/06738 |
| | | | 324/755.01 |
| 2013/0026981 A1 | 1/2013 | Van Der Lee | |
| 2016/0341790 A1 | 11/2016 | Thompson et al. | |

* cited by examiner

CONTACT ENGINES, PROBE HEAD ASSEMBLIES, PROBE SYSTEMS, AND ASSOCIATED METHODS FOR ON-WAFER TESTING OF THE WIRELESS OPERATION OF A DEVICE UNDER TEST

RELATED APPLICATION

This application claims priority to U.S. Provisional Patent Application No. 62/428,297, entitled CONTACT ENGINES, PROBE HEAD ASSEMBLIES, AND PROBE SYSTEMS FOR ON-WAFER TESTING OF THE WIRELESS OPERATION OF A DEVICE UNDER TEST, which was filed on Nov. 30, 2016, and the complete disclosure of which is hereby incorporated by reference.

FIELD OF THE DISCLOSURE

The present disclosure is directed to contact engines, to probe head assemblies, and/or to probe systems for on-wafer testing of the wireless operation of a device under test.

BACKGROUND OF THE DISCLOSURE

The trend in electronic device production, particularly in integrated circuit technology, has been toward fabricating larger numbers of discrete circuit elements with higher operating frequencies and smaller circuit geometries on a single device substrate. After these devices are fabricated, they may be subject to various electrical tests to verify functionality, quantify operating characteristics, and/or characterize the manufacturing process. Additionally or alternatively, the devices may be packaged for communication with other devices and/or electronic components.

Traditionally, the electrical tests have been performed by forming a plurality of electrical contacts with a device under test (DUT) and providing electric current to the DUT in the form of input power and/or test signals, as well as receiving electric current from the DUT in the form of output, or resultant, signals. The response of the DUT to various input test signals and/or power levels may then be quantified through analysis of the input and/or output signals.

More recently, integrated circuit devices with on-board wireless capabilities have been developed. However, testing technologies have not kept pace with this advancement, and the current state-of-the-art requires that these integrated circuit devices be singulated and packaged prior to being tested for functionality. Since such a process inherently will singulate and package both functional and non-functional integrated circuit devices, this testing strategy is time-consuming, costly, and wastes valuable resources. Thus, there exists a need for contact engines, probe head assemblies, and probe systems for on-wafer testing of the wireless operation of a device under test.

SUMMARY OF THE DISCLOSURE

Contact engines, probe head assemblies, probe systems, and associated methods for on-wafer testing of the wireless operation of a device under test (DUT). A contact engine for testing a DUT includes a flexible dielectric membrane having a first surface and an opposed second surface. The contact engine further includes a plurality of probes supported by the flexible dielectric membrane. The plurality of probes are oriented, relative to one another, to contact a plurality of contact locations on the DUT. Each probe in the plurality of probes includes a corresponding probe tip that projects from the second surface of the flexible dielectric membrane and is configured to electrically and physically contact a corresponding contact location of the plurality of contact locations. The contact engine further includes at least one membrane antenna supported by the flexible dielectric membrane. A probe head assembly includes the contact engine. A probe system includes the probe head assembly. Associated methods include methods of utilizing the contact engine.

DETAILED DESCRIPTION AND BEST MODE OF THE DISCLOSURE

Figure 1:
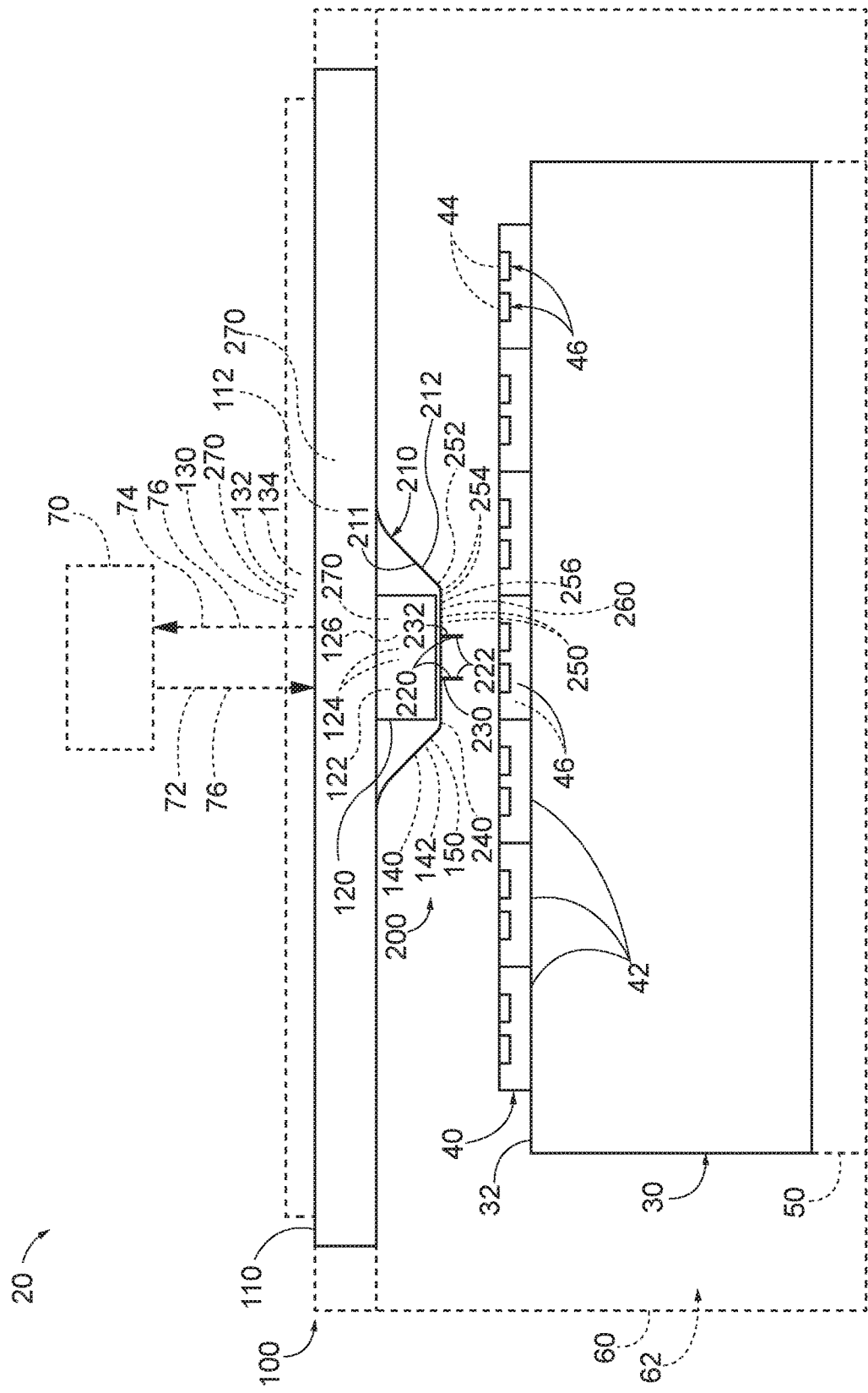
FIG. 1 is a schematic representation of examples of probe systems with probe head assemblies including contact engines, according to the present disclosure.

FIGS. 1-15 provide examples of contact engines 200, of probe head assemblies 100 including contact engines 200, of probe systems 20 including probe head assemblies 100, and/or of methods for testing devices under test, according to the present disclosure. Elements that serve a similar, or at least substantially similar, purpose are labeled with like numbers in each of FIGS. 1-15, and these elements may not be discussed in detail herein with reference to each of FIGS. 1-15. Similarly, all elements may not be labeled in each of FIGS. 1-15, but reference numerals associated therewith may be utilized herein for consistency. Elements, components, and/or features that are discussed herein with reference to one or more of FIGS. 1-15 may be included in and/or utilized with any of FIGS. 1-15 without departing from the scope of the present disclosure.

In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

FIG. 1 is a schematic representation of examples of probe systems 20 according to the present disclosure. As discussed in more detail herein, probe systems 20 may be configured to perform one or more test sequences on a device under test (DUT) 42, such as by providing one or more input signals to DUT 42 and/or by receiving one or more resultant, or output, signals from the DUT. As schematically illustrated in FIG. 1, probe system 20 includes a chuck 30 defining a support surface 32 configured to support a substrate 40 that includes a plurality of DUTs 42. Probe system 20 further includes a probe head assembly 100 that includes a platen 110, a contact engine support structure 120 operatively attached to platen 110, and a contact engine 200 for testing DUTs 42.

Contact engine 200 includes a plurality of probes 220 oriented to contact a corresponding plurality of contact locations 44 on DUTs 42. Each probe 220 of the plurality of probes 220 includes a corresponding probe tip 222 configured to electrically and physically contact a corresponding contact location 44 of the plurality of contact locations 44. The electrically and physically contacting may be accomplished in any appropriate manner. For example, the plurality of contact locations 44 of DUTs 42 may include and/or be a plurality of contact pads, and at least a subset of the plurality of probe tips 222 may be configured to be in electrical contact with the plurality of contact pads. Additionally or alternatively, the plurality of contact locations 44 of DUTs 42 may include and/or be a plurality of solder balls, and at least a subset of the plurality of probe tips 222 may be configured to be in electrical contact with the plurality of solder balls.

Figure 2:
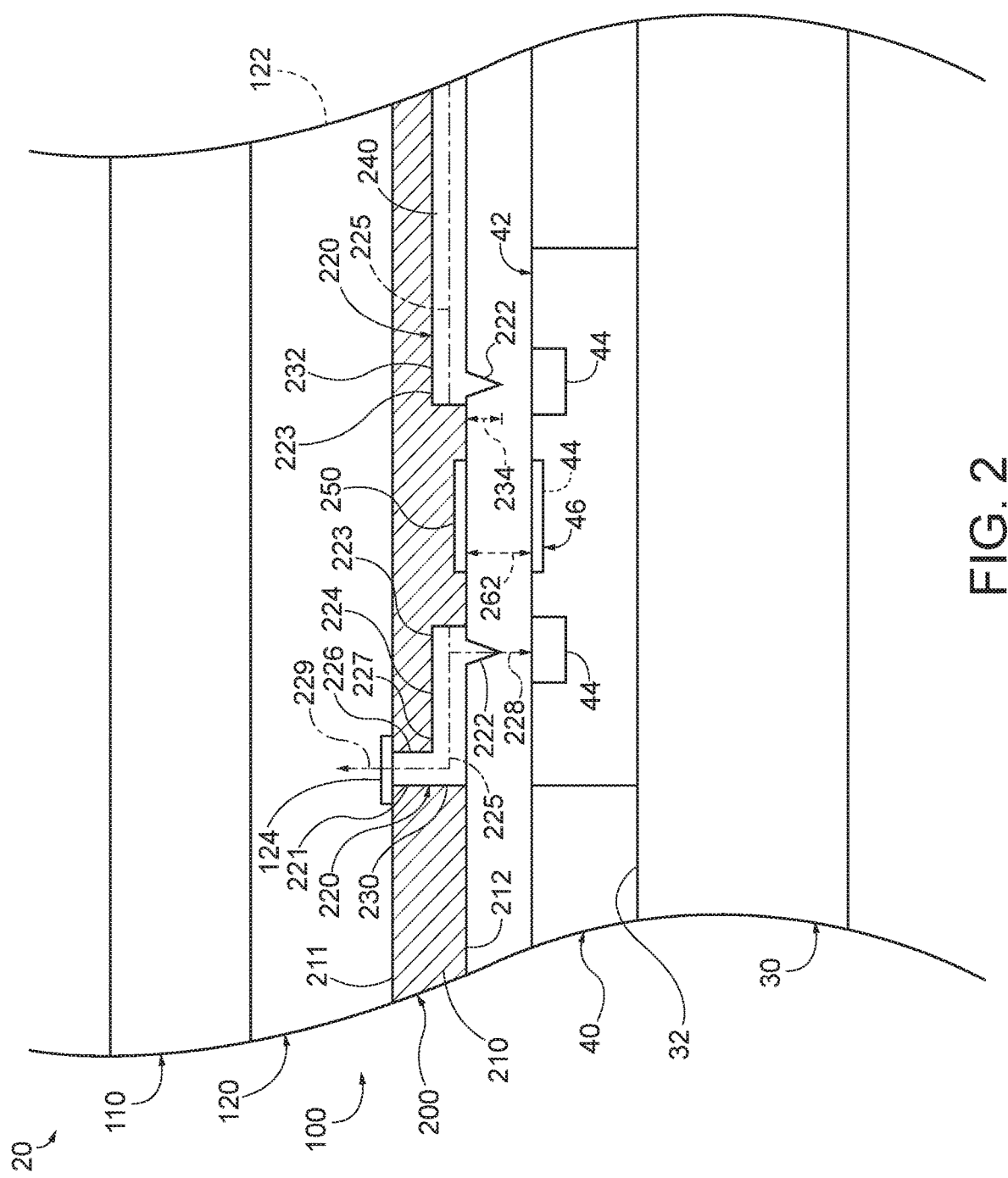
FIG. 2 is a schematic representation of a portion of a probe system, according to the present disclosure.

FIG. 1 illustrates probes 220 schematically to indicate that the probes may take any appropriate form. For example, and as illustrated in FIG. 2, the plurality of probes 220 may include and/or be a plurality of rocking beam probes 221, each of which includes a probe beam 224 with an elongate beam axis 225 and/or a beam post 226. Beam post 226 may extend from a beam post side 227 of the probe beam, and/or probe tip 222 may extend from a probe tip side 223 of the probe beam. Additionally or alternatively, probe tip 222 may extend from probe beam 224 in a probe extension direction 228, and beam post 226 may extend from probe beam 224 in a beam post extension direction 229 that is at least substantially opposed to the probe extension direction.

Probes 220 may be configured to electrically interconnect contact engine 200 and DUTs 42 in any appropriate manner. Returning to FIG. 1, and more generally to FIGS. 2-6, probes 220 may be configured to provide DUT 42 with electrical power. As a more specific example, at least one probe 220 in the plurality of probes 220 may be a power supply probe 230 configured to convey a power supply electric current 76 to DUT 42. Similarly, at least one probe 220 in the plurality of probes 220 may be a power receipt, or ground, probe 232 configured to receive power supply electric current 76 from DUT 42. Stated differently, the plurality of probes 220 may include each of a power supply probe 230 and a power receipt probe 232 configured to electrically contact respective unique contact locations 44 on DUT 42 so as to form an electrical circuit with the DUT and/or to convey electric current to and/or from the DUT. Power supply probe 230 and power receipt probe 232 both are not required of all embodiments. As an example, support surface 32 of chuck 30 may be utilized to provide the power supply electric current to the DUT and/or to receive the power supply electric current from, or to ground, the DUT.

Figure 3:
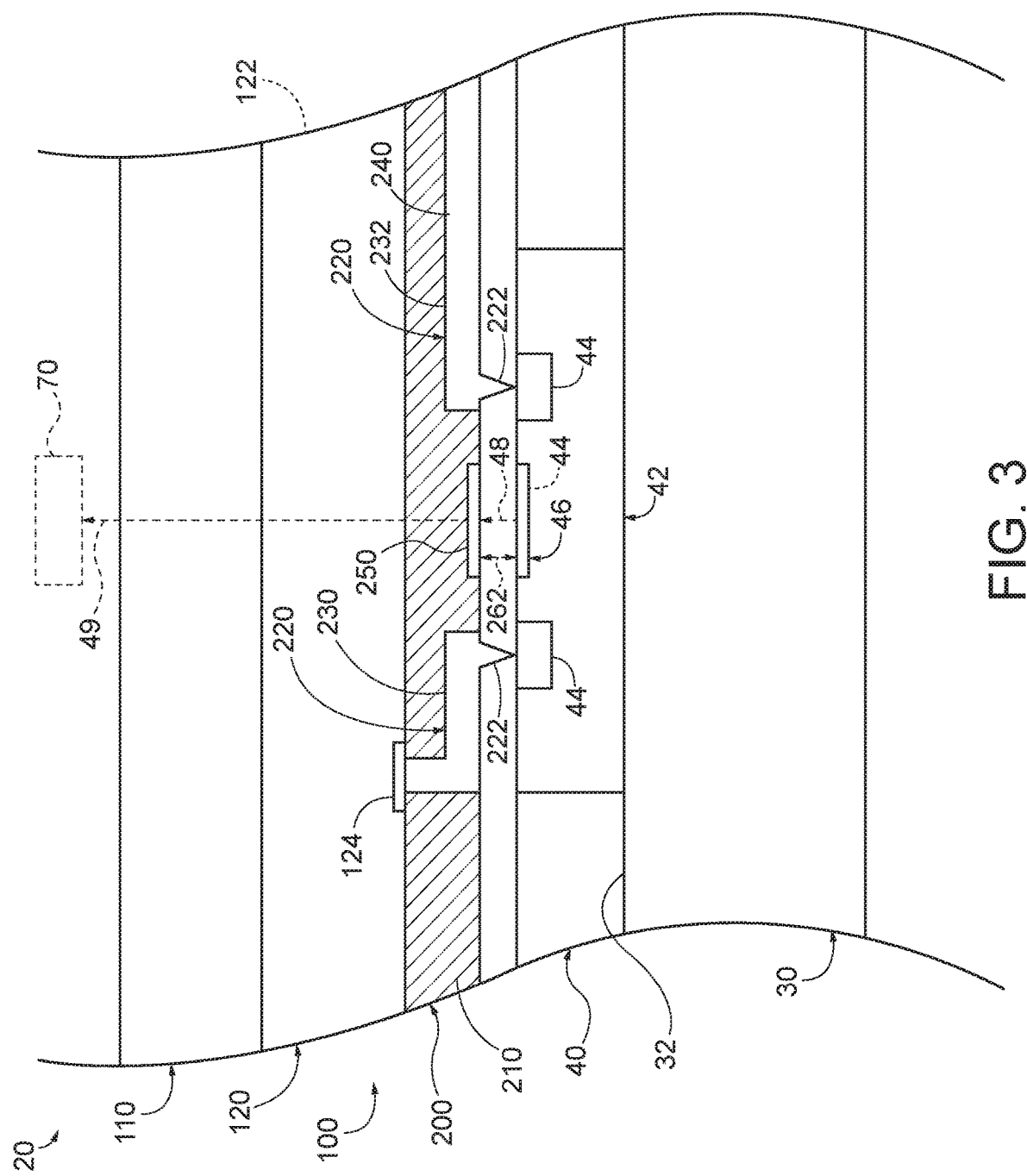
FIG. 3 is a schematic representation of a portion of a probe system, according to the present disclosure, configured for wireless data transfer between a DUT antenna and a membrane antenna.
Figure 4:
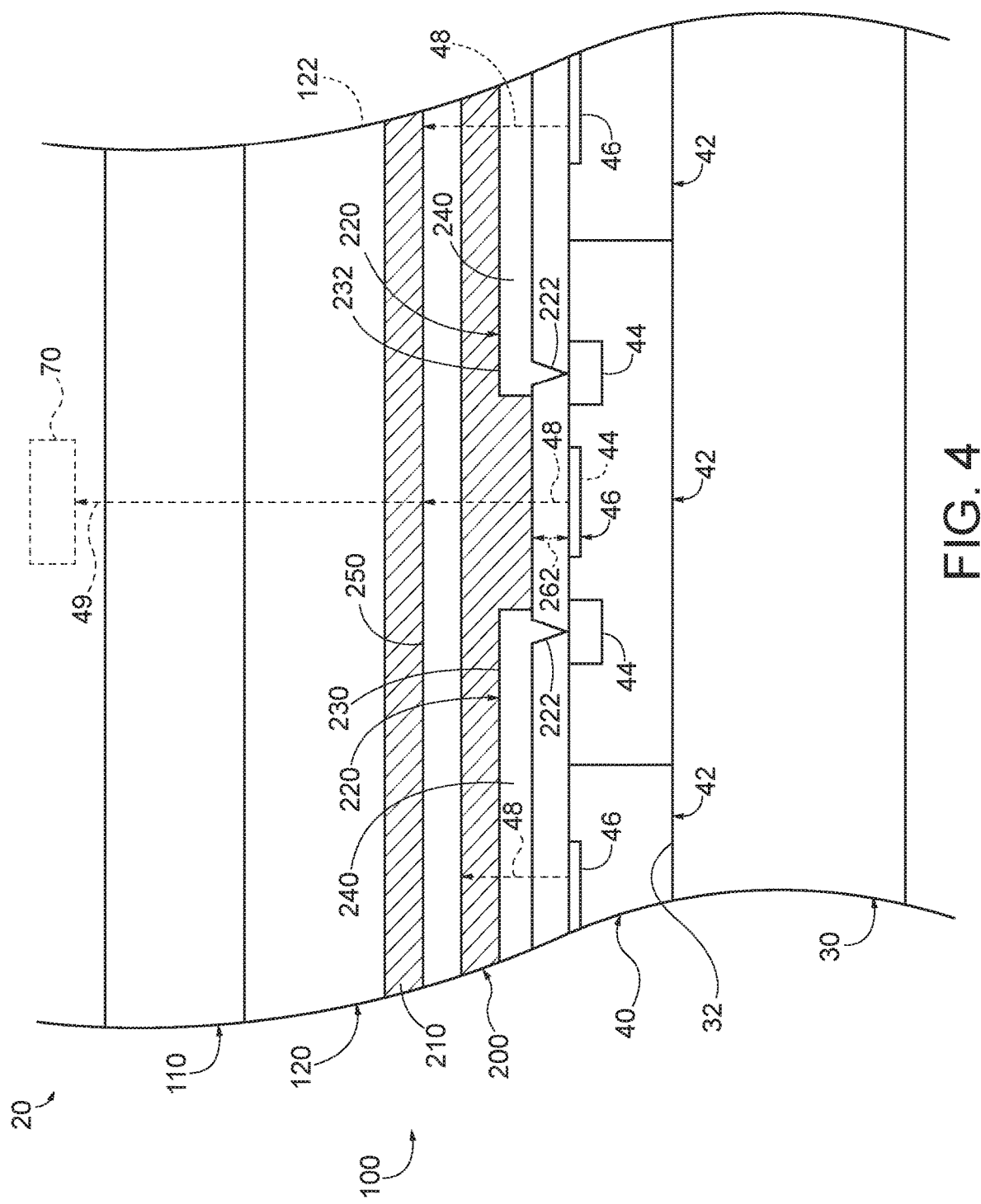
FIG. 4 is a schematic representation of a portion of a probe system, according to the present disclosure, configured for wireless data transfer between a plurality of DUT antennas and a membrane antenna.

As schematically illustrated in FIGS. 1 and 3-4, probe system 20 further may include a signal generation and analysis assembly 70 configured to send electric signals to and/or receive electric signals from probes 220. As examples, and as illustrated in FIG. 1, signal generation and analysis assembly 70 may be configured to provide at least one test signal electric current 72 to a selected probe 220 of the plurality of probes 220 and/or to receive at least one resultant signal electric current 74 from the selected probe. Additionally or alternatively, signal generation and analysis assembly 70 may be configured to provide at least one power supply electric current 76 to a selected probe 220 of the plurality of probes 220 and/or to receive at least one power supply electric current 76 from the selected probe.

As schematically illustrated in FIGS. 1-6, contact engine 200 further includes a flexible dielectric membrane 210, which may be configured to facilitate electrical contact between the plurality of probes 220 and the plurality of contact locations 44. For example, the plurality of probes 220 may be supported by flexible dielectric membrane 210 such that a compliance of flexible dielectric membrane 210 may permit individual probes 220 to translate with respect to one another (such as along probe extension direction 228), thus facilitating consistent electrical and/or physical contact between each probe 220 and corresponding contact location 44. As illustrated in FIGS. 2-6, probes 220 may extend partially through flexible dielectric membrane 210, may extend completely through flexible dielectric membrane 210, and/or may extend perpendicular, or at least substantially perpendicular, to a surface of flexible dielectric membrane 210 that is configured to face toward DUT 42.

More specifically, and as illustrated in FIGS. 1-2, flexible dielectric membrane 210 may have a first surface 211 that faces away from support surface 32 and an opposed second surface 212 that faces toward support surface 32, such that the probe tip 222 of each probe 220 in the plurality of probes 220 projects from the second surface. Additionally or alternatively, when probes 220 are rocking beam probes, contact engine 200 may be configured such that elongate beam axis 225 of each probe beam 224 extends at least substantially parallel to second surface 212 of flexible dielectric membrane 210. Additionally or alternatively, when probes 220 are rocking beam probes, at least a portion of beam post 226 of each probe 220 may project from first surface 211 of flexible dielectric membrane 210, may be flush with first surface 211 of the flexible dielectric membrane, and/or may be exposed on first surface 211 of the flexible dielectric membrane. Flexible dielectric membrane 210 may include, consist essentially of, and/or be any appropriate material composition. As an example, flexible dielectric membrane 210 may include and/or be a polyimide membrane.

With continued reference to FIGS. 1-2, flexible dielectric membrane 210 may be mechanically supported by contact engine support structure 120 such that first surface 211 of the flexible dielectric membrane faces toward and/or contacts the contact engine support structure and such that second surface 212 of the flexible dielectric membrane faces away from the contact engine support structure. Contact engine support structure 120 may include an electrically insulating and/or dielectric material, such as to electrically isolate flexible dielectric membrane 210 and/or probe head assembly 100 from a remainder of probe system 20. Additionally or alternatively, and as perhaps best illustrated in FIG. 2, contact engine support structure 120 may include and/or be a space transformer 122, which is configured to provide a plurality of electric signals to the plurality of probes 220 and/or to receive a plurality of electric signals from the plurality of probes 220. As an example, space transformer 122 may include a plurality of space transformer contact pads 124, and at least a subset of the plurality of probes 220 may electrically contact a corresponding one of the plurality of space transformer contact pads 124.

As illustrated in dashed lines in FIG. 1, probe system 20 additionally may include a translation structure 50 configured to selectively and electrically contact the plurality of probes 220 with the corresponding plurality of contact locations 44 on DUTs 42. Specifically, translation structure 50 may be configured to spatially translate chuck 30 in a direction that is parallel, or at least substantially parallel, to support surface 32, to spatially translate chuck 30 in a direction that is perpendicular, or at least substantially perpendicular, to support surface 32, and/or to rotate chuck 30 about the direction that is perpendicular to the support surface, such as to align probes 220 with contact locations 44 and/or to bring probes 220 into physical and/or electrical contact with corresponding contact locations 44.

As also illustrated in dashed lines in FIG. 1, probe system 20 may include an enclosure 60 that defines an enclosed volume 62, such that at least support surface 32 extends within enclosed volume 62. As examples, enclosure 60 may be configured to provide electrical, thermal, and/or environmental shielding to support surface 32.

Probe system 20 may be configured such that probes 220 are in electrical communication with any appropriate component of the probe system. For example, and as illustrated in FIGS. 2-4, contact engine 200 may include a plurality of probe-connected electrical traces 240 supported by flexible dielectric membrane 210, such that each of the plurality of probe-connected electrical traces 240 is in electrical communication with a corresponding probe 220.

Figure 6:
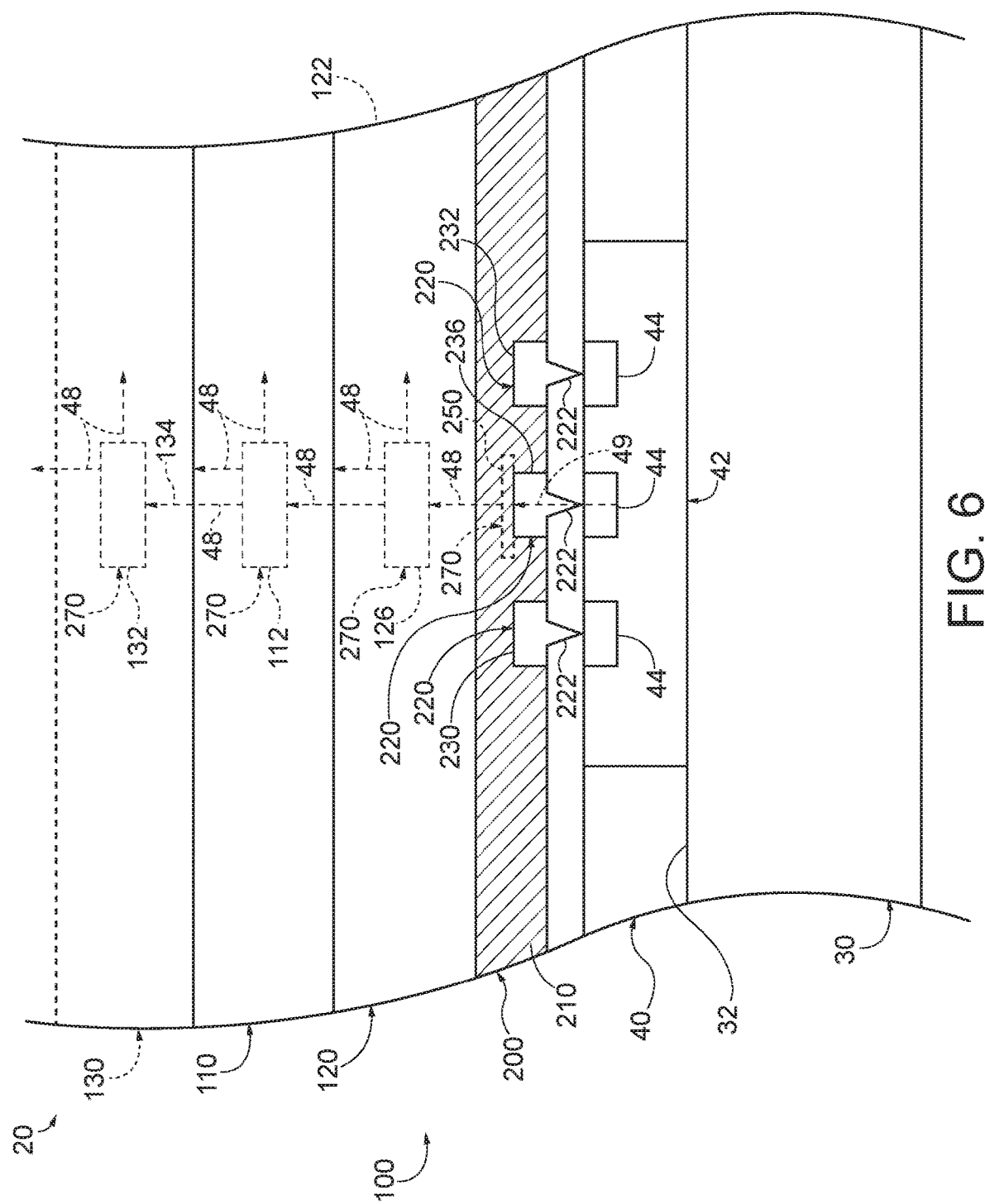
FIG. 6 is a schematic representation of a portion of a probe system, according to the present disclosure, configured for data transfer to a location spatially removed from the DUT.

As illustrated in dashed lines in FIGS. 1 and 6, probe head assembly 100 further may include a printed circuit board (PCB) 130 that is in electrical communication with at least a subset of the plurality of probes 220. As an example, PCB 130 may include a PCB antenna 132, and probe head assembly 100 may include a PCB antenna conductor 134 that provides electrical communication between PCB antenna 132 and a corresponding probe 220 of the plurality of probes 220.

Probe system 20 further may be configured to facilitate wireless and/or non-contact signal transfer between probe head assembly 100 and DUTs 42 and/or to facilitate wireless and/or non-contact signal transfer between DUT 42 and another structure that is external to probe head assembly 100. For example, and as illustrated in FIGS. 1-6, contact engine 200 may include a membrane antenna 250 supported by, integrated into, and/or operatively coupled to flexible dielectric membrane 210.

Membrane antenna 250 may not contact, or electrically contact, DUT 42. Instead, and as discussed, membrane antenna 250 may be configured for wireless and/or non-contact signal transfer between the probe head assembly and the DUT and/or between the probe head assembly and the other structure. However, contact engine 200 still may be referred to herein as including the membrane antenna since the membrane antenna is supported by flexible dielectric membrane 210. A contact engine 200 that includes a membrane antenna 250 also may be referred to herein as a membrane assembly 200, as a membrane contacting assembly 200, and/or as a membrane assembly 200 that is configured for both contact and non-contact signal transfer.

Figure 7:
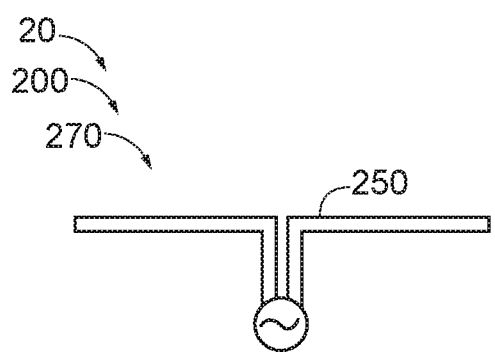
FIG. 7 is a schematic representation of a linear dipole membrane antenna.
Figure 8:
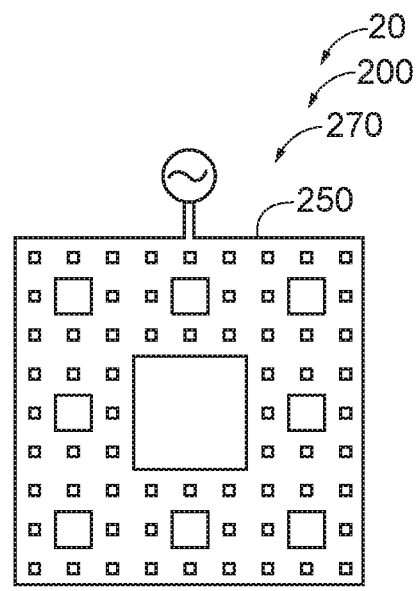
FIG. 8 is a schematic representation of a fractal membrane antenna.
Figure 9:
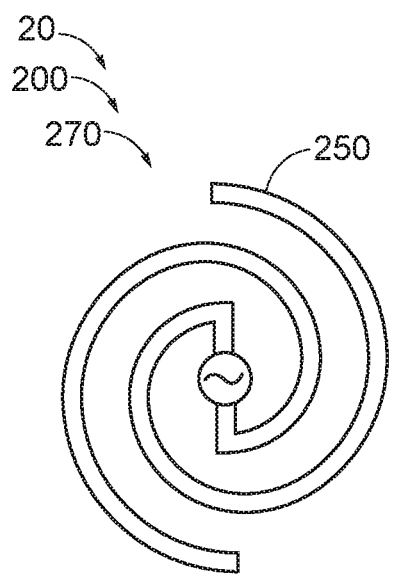
FIG. 9 is a schematic representation of a spiral membrane antenna.
Figure 10:
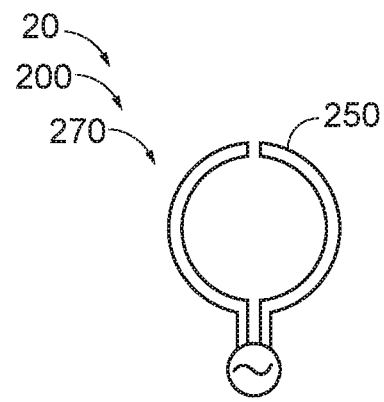
FIG. 10 is a schematic representation of a loop dipole membrane antenna.
Figure 11:
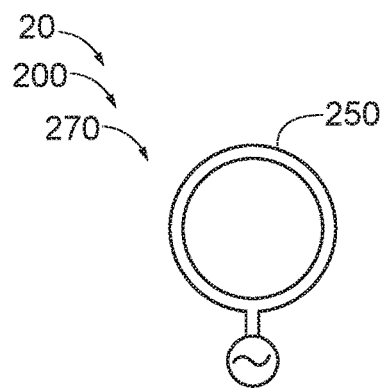
FIG. 11 is a schematic representation of a loop monopole membrane antenna.
Figure 12:
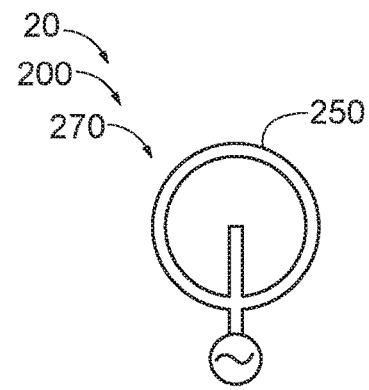
FIG. 12 is a schematic representation of a hybrid loop-bar monopole membrane antenna.
Figure 13:
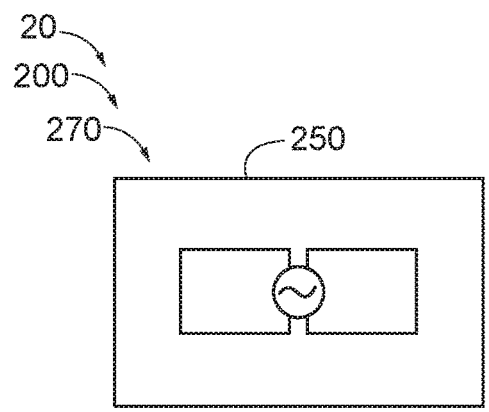
FIG. 13 is a schematic representation of a slot membrane antenna.
Figure 14:
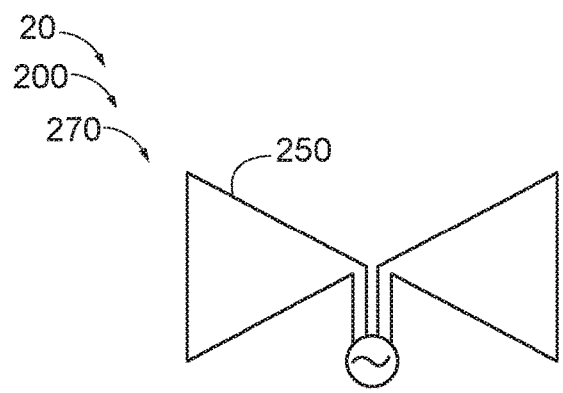
FIG. 14 is a schematic representation of a bowtie membrane antenna.

Membrane antenna 250 may take any appropriate form, and may include and/or be a thin-film membrane antenna and/or a lithographically defined membrane antenna. Additionally, membrane antenna 250 may assume any appropriate geometry, examples of which are illustrated in FIGS. 7-14. More specifically, examples of membrane antennas 250 according to the present disclosure include a linear dipole membrane antenna (schematically illustrated in FIG. 7), a fractal membrane antenna (schematically illustrated in FIG. 8), a spiral membrane antenna (schematically illustrated in FIG. 9), a loop dipole membrane antenna (schematically illustrated in FIG. 10), a loop monopole membrane antenna (schematically illustrated in FIG. 11), a hybrid loop-bar monopole membrane antenna (schematically illustrated in FIG. 12), a slot membrane antenna (schematically illustrated in FIG. 13), a bowtie membrane antenna (schematically illustrated in FIG. 14), and/or any suitable combination thereof. As illustrated in FIG. 7, a linear dipole membrane antenna may include two antenna elements that are adjacent and at least substantially collinear with one another. As illustrated in FIG. 8, a fractal membrane antenna may include an antenna element that is at least substantially planar and that is shaped to include geometric features with a plurality of respective sizes. As examples, the geometric features may include and/or be triangles, squares, rectangles, polygons, and/or circles. Additionally or alternatively, a fractal membrane antenna may be characterized by a shape and/or a pattern that at least substantially repeats at a plurality of length scales. As illustrated in FIG. 9, a spiral membrane antenna may include at least one antenna element that extends in an at least substantially spiral pattern. As illustrated in FIG. 10, a loop dipole membrane antenna may include two antenna elements that are at least substantially coplanar with one another and oriented to at least substantially form a loop, optionally a circular loop. As illustrated in FIG. 11, a loop monopole membrane antenna may include an antenna element that is oriented to at least substantially form a loop, optionally a circular loop. As illustrated in FIG. 12, a hybrid loop-bar monopole membrane antenna may include an antenna element that is oriented to at least substantially form a loop, optionally a circular loop, as well as a linear portion that extends at least partially within the loop. As illustrated in FIG. 13, a slot membrane antenna may include an antenna element that is at least substantially planar and that includes at least one slot, optionally a rectangular slot, defined within an area of the antenna element. As illustrated in FIG. 14, a bowtie membrane antenna may include two antenna elements that are at least substantially coplanar and that have similar shapes that extend from a common central point. Membrane antenna 250 may be configured to transmit and/or receive a wireless signal of any appropriate wavelength. For example, membrane antenna 250 may be configured to convey a wireless signal that has a wireless signal wavelength, and may define and/or be characterized by a membrane antenna length that is any appropriate fraction of the wireless signal wavelength. As an example, the membrane antenna length of membrane antenna 250 may be one-half, one-fourth, one-tenth, one-twentieth, one-fiftieth, and/or one-one hundredth of the wireless signal wavelength. Additionally or alternatively, membrane antenna 250 may be characterized by a characteristic linear dimension thereof, such as a diameter, an effective diameter, a maximum extent, and/or a maximum length. As examples, membrane antenna 250 may have a characteristic linear dimension that is at least 50 micrometers (μm), at least 100 μm, at least 200 μm, at least 500 μm, at least 1000 μm, at least 1500 μm, at most 2000 μm, at most 1700 μm, at most 1300 μm, at most 700 μm, at most 300 μm, and/or at most 100 μm. Additionally or alternatively, flexible dielectric membrane 210 may include at least one tuning structure 260, which is configured to tune and/or selectively vary a resonant frequency of membrane antenna 250. As examples, the tuning structure may include a tuning capacitor and/or a tuning inductor.

Membrane antenna 250 may be configured to receive an excitation signal from any appropriate component of probe system 20. As an example, and as illustrated in FIG. 6, at least one probe 220 in the plurality of probes 220 may be a membrane antenna-connected probe configured to electrically interconnect membrane antenna 250 and DUT 42, such as to permit excitation of the membrane antenna by the DUT.

It is additionally within the scope of the present disclosure that contact engine 200 may include a plurality of membrane antenna 250. For example, membrane antenna 250 may be a first membrane antenna 250 of the plurality of membrane antenna, and contact engine 200 may include the plurality of membrane antenna supported by flexible dielectric membrane 210. In such a configuration, and as illustrated in FIG. 1, contact engine 200 may include a data signal conductor 252, a plurality of membrane antenna conductors 254, and a switching matrix 256, such that the data signal conductor is in electrical communication with the switching matrix and such that each of the plurality of membrane antenna conductors provides electrical communication between the switching matrix and a corresponding one of the plurality of membrane antenna 250. Switching matrix 256 further may be configured to selectively interconnect data signal conductor 252 with each of the plurality of membrane antenna conductors 254.

Membrane antenna 250 additionally or alternatively may be configured to provide wireless data transfer between contact engine 200 and DUT 42. Such a configuration may facilitate characterization of DUT 42 without the need to singulate and/or package the DUT prior to testing. As an example, and as illustrated in FIGS. 1-5, DUT 42 may include a DUT antenna 46, such that membrane antenna 250 is in wireless communication with DUT antenna 46. DUT 42 may include a single DUT antenna 46 or a plurality of DUT antennas 46, and the plurality of DUTs on substrate 40 each may include at least one DUT antenna 46. DUT antenna 46 may include and/or be any suitable structure for wireless communication with membrane antenna 250. For example, DUT antenna 46 may include and/or be an antenna configured for wireless communication, and/or may be similar in form and/or geometry to membrane antenna 250. Stated another way, DUT antenna 46 may include and/or be any of the antenna structures disclosed herein with reference to DUT antenna 250.

Additionally or alternatively, DUT antenna 46 may include and/or be a structure that otherwise is configured for electrical communication via physical contact, such as a contact pad, a solder ball, and/or another contact location 44 of DUT 42. Stated differently, membrane antenna 250 may be configured for wireless communication with a contact location 44 of DUT 42 that is not specifically configured for wireless communication and/or that instead is configured for wired communication when the DUT is installed and/or utilized in an intended operating environment thereof. Stated another way, and during communication with membrane antenna 250, a contact location 44 of DUT 42 may function as and/or may be a DUT antenna 46. Such communication may be permitted and/or facilitated by near-field coupling between the membrane antenna and the contact location, as discussed in more detail herein. As an example, the near-field coupling between the membrane antenna and the contact location may permit the membrane antenna to induce an electric current, within the contact location, that is sufficient to be recognized, utilized, responded to, and/or acted on by the DUT. This induced electric current may be similar in magnitude to an electric current that is provided to the contact location via a wired connection when the DUT is utilized in its intended operating environment.

DUT 42 may include a single DUT antenna 46 or a plurality of DUT antennas 46, and/or a plurality of DUTs each may include at least one DUT antenna 46. Each membrane antenna 250 may be configured to wirelessly communicate with a single corresponding DUT antenna 46, and/or may be configured to wirelessly communicate, or to simultaneously wirelessly communicate, with a corresponding plurality of DUT antennas. As an example, a single membrane antenna 250 may be sized, positioned, and/or otherwise configured to wirelessly communicate with each of at least two DUT antennas 46, at least three DUT antennas, at least five DUT antennas, at least 10 DUT antennas at least 20 DUT antennas, at most 35 DUT antennas, at most 25 DUT antennas, at most 15 DUT antennas, and at most five DUT antennas.

Membrane antenna 250 may be configured to wirelessly communicate with the corresponding plurality of DUT antennas 46 sequentially and/or in parallel. Such a configuration may permit probe system 20 to wirelessly communicate with a greater number of DUT antennas 46 relative to a probe system 20 in which each membrane antenna 250 is configured to wirelessly communicate with only one DUT antenna. For example, probe system 20 may include and/or be characterized by a fixed number of testing channels, which may correspond to an upper limit on the number of membrane antennas 250 that may be utilized, or simultaneously utilized, by the probe system. In a probe system 20 in which each membrane antenna 250 is configured to wirelessly communicate with only one DUT antenna 46, the number of testing channels also may correspond to the maximum number of DUT antennas that may be interrogated, or simultaneously interrogated, by the membrane antennas without repositioning DUT 42 relative to the probe system. By contrast, in a probe system 20 in which each membrane antenna 250 is configured to wirelessly communicate with a plurality of DUT antennas 46, the number of DUT antennas that may be interrogated by the membrane antennas without repositioning DUT 42 relative to the probe system may be several times larger than the number of testing channels of the probe system.

As discussed, membrane antenna 250 may be configured to operate in a near-field coupling regime for communication with DUT antenna 46. Stated differently, membrane antenna 250 may be configured to operate at a distance from DUT antenna 46 that is sufficiently small that wireless communication between the membrane antenna and the DUT antenna takes place at least partially via non-radiative electrical and/or magnetic effects. However, this is not required to all membrane antennas 250, and it is within the scope of the present disclosure that DUT antenna 46 and/or membrane antenna 250 be configured to communicate via any appropriate protocol and/or mechanism. In a configuration in which membrane antenna 250 operates in a near-field coupling regime, such a configuration may facilitate wireless communication. For example, operation in a near-field coupling regime may facilitate wireless communication between membrane antenna 250 and DUT antennas 46 not specifically configured for wireless communication, such as contact locations 44. Such a configuration also may facilitate robust wireless communication, such as wireless communication that is operable over a wide range of frequencies of a wireless signal transmitted and/or received by membrane antenna 250. As examples, membrane antenna 250 may be configured to operate with a bandwidth of at least 25 Gigahertz (GHz), at least 50 GHZ, at least 75 GHZ, and/or at least 100 GHz. As further examples, membrane antenna 250 may be configured to operate at a frequency that is at least 1 GHz, at least 5 GHz, at least 10 GHz, at least 20 GHz, at least 50 GHz, at least 100 GHz, at most 150 GHz, at most 70 GHz, at most 30 GHz, and/or at most 7 GHz.

During testing of DUTs 42, membrane antenna 250 may be spaced apart from DUT 42 and/or DUT antenna 46 by any appropriate separation distance 262. That is, and as illustrated in FIGS. 2-5, separation distance 262 may refer to a distance, as measured along probe extension direction 228, between membrane antenna 250 and DUT 42, between the membrane antenna and a selected DUT of the plurality of DUTs, between the membrane antenna and DUT antenna 46, and/or between the membrane antenna and a selected DUT antenna of the plurality of DUT antennas.

Separation distance 262 may be selected to facilitate wireless communication between membrane antenna 250 and DUT antenna 46. As more specific examples, separation distance 262 may be at least 10 micrometers, at least 20 micrometers, at least 30 micrometers, at least 40 micrometers, at least 50 micrometers, at least 75 micrometers, at least 100 micrometers, at most 5 millimeters, at most 4 millimeters, at most 3 millimeters, at most 2 millimeters, at most 1 millimeter, at most 750 micrometers, at most 500 micrometers, at most 400 micrometers, at most 300 micrometers, at most 200 micrometers, at most 150 micrometers, at most 100 micrometers, and/or at most 75 micrometers.

A minimum distance between membrane antenna 250 and DUT 42 may be defined by probe tip 222. Stated differently, and as illustrated in FIG. 2, probe tip 222 of probe 220 may extend by a probe tip length 234, as measured from membrane antenna 250 and along probe extension direction 228, such that membrane antenna 250 and DUT 42 are physically impeded from being brought to a configuration in which separation distance 262 is less than the probe tip length without probe tip 222 contacting contact location 44.

Figure 15:
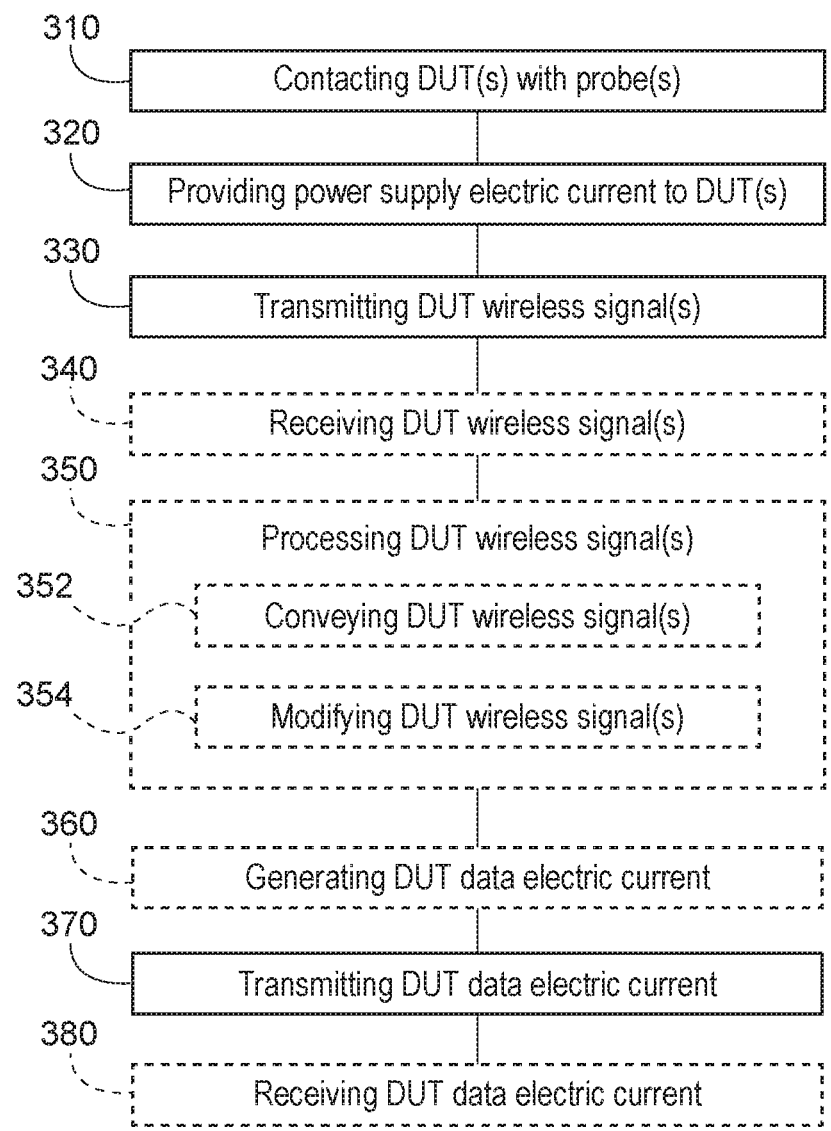
FIG. 15 is a flowchart depicting methods, according to the present disclosure, of utilizing a probe system to test one or more DUTs.

FIG. 15 is a flowchart depicting methods 300, according to the present disclosure, of utilizing a probe system (such as probe system 20) to test one or more DUTs (such as DUTs 42). Methods 300 include contacting, at 310, at least one DUT with a corresponding at least one probe (such as probe 220) of the probe system, and providing, at 320, a power supply electrical current to the at least one DUT via the at least one probe. Methods 300 further include transmitting, at 330, at least one DUT wireless signal, and may include receiving, at 340, the at least one DUT wireless signal. Methods 300 further may include processing, at 350, the DUT wireless signal, which may include conveying, at 352, the DUT wireless signal and/or modifying, at 354, the DUT wireless signal. Methods 300 additionally may include generating, at 360, a DUT data electric current, which may be based, at least in part, on the DUT wireless signal. Methods 300 further include transmitting, at 370, the DUT data electric current, and may include receiving, at 380, the DUT data electric current. As discussed in more detail below with reference to the embodiments of FIGS. 3-6, methods 300 may be performed in any appropriate order, and may include any appropriate number of the steps shown in FIG. 15.

Turning now to the more detailed embodiments of FIGS. 3-6, FIG. 3 illustrates an embodiment of probe system 20 configured for wireless data transfer between DUT antenna 46 and membrane antenna 250. In the embodiment of FIG. 3, DUT 42 receives electrical power via direct contact, or direct electrical contact, with probe head assembly 100. Specifically, the plurality of probes 220 includes power supply probe 230, which is configured to convey the power supply electric current to DUT 42 and power receipt probe 232, which is configured to receive the power supply electric current from DUT 42. DUT 42 also includes DUT antenna 46, and the DUT antenna is configured to generate a DUT wireless signal 48 responsive to application of power to the DUT via probes 220. In addition, contact engine 200 includes membrane antenna 250, which is configured to receive DUT wireless signal 48 from DUT antenna 46, and probe head assembly 100 may be configured to generate a DUT data electric current 49, which may be based upon DUT wireless signal 48, responsive to receipt of the DUT wireless signal by the membrane antenna. Probe head assembly 100 further may be configured to convey DUT data electric current 49 to signal generation and analysis assembly 70, such as to permit the signal generation and analysis assembly to characterize the operation of the DUT.

With reference to the flowchart of FIG. 15, the embodiment of probe system 20 that is schematically illustrated in FIG. 3 may be utilized to perform examples of methods 300. In such a method, the contacting at 310 may include bringing power supply probe 230 and/or power receipt probe 232 into contact with respective contact locations 44 of DUT 42. This may include translating chuck 30 with respect to probe head assembly 100 and/or translating at least a portion of the probe head assembly with respect to the chuck. The providing at 320 may include providing the power supply electric current to DUT 42. The transmitting at 330 may include generating one or more DUT wireless signals 48 with each of a corresponding one or more DUT antennas 46 responsive to receipt of the power supply electric current by the DUT(s), and further may include sending DUT wireless signal 48 with DUT antenna 46. The receiving at 340 may include receiving the DUT wireless signal with membrane antenna 250. The generating at 360 may include generating DUT data electric current 49 based upon DUT wireless signal 48. The transmitting at 370 may include conveying the DUT data electric current to signal generation and analysis assembly 70.

FIG. 4 illustrates an embodiment of probe system 20, which is configured for wireless data transfer between a plurality of DUT antennas 46 and a single membrane antenna 250. The embodiment of FIG. 4 is similar to the embodiment of FIG. 3 in that the plurality of probes 220 includes power supply probe 230, which is configured to convey the power supply electric current to DUT 42, and power receipt probe 232, which is configured to receive the power supply electric current from DUT 42. Additionally, in the embodiment of FIG. 4, substrate 40 includes a plurality of DUTs 42 and/or a plurality of DUT antennas 46, and the single membrane antenna 250 is configured to receive a corresponding DUT wireless signal 48 from each of the plurality of DUT antennas 46. In such an embodiment, probe head assembly 100 may be configured to generate DUT data electric current 49 based upon the corresponding DUT wireless signals 48 and to convey DUT data electric current 49 to signal generation and analysis assembly 70.

With reference to the flowchart of FIG. 15, the embodiment of probe system 20 that is schematically illustrated in FIG. 4 may be utilized to perform examples of methods 300. In such a method, the contacting at 310 may include bringing at least power supply probe 230 and power receipt probe 232 into contact with respective contact locations 44 of DUT 42. This may include translating chuck 30 with respect to probe head assembly 100 and/or translating at least a portion of the probe head assembly with respect to the chuck. The providing at 320 may include providing the power supply electric current to one or more DUTs 42. The transmitting at 330 may include generating one or more DUT wireless signals 48 with each of a corresponding one or more DUT antennas 46 responsive to receipt of the power supply electric current by the DUT(s), and further may include sending the one or more DUT wireless signals with each of the one or more DUT antennas 46. The receiving at 340 may include receiving the one or more DUT wireless signals with membrane antenna 250. In an embodiment of probe system 20 that includes a plurality of DUT antennas 46, the transmitting at 330 may include transmitting DUT wireless signals 48 from each of the DUT antennas in parallel (i.e., simultaneously), and/or may include transmitting the DUT wireless signals from each of the DUT antennas in series (i.e., sequentially). Similarly, the receiving at 340 may include receiving each of DUT wireless signals 48 by membrane antenna 250 in parallel (i.e., simultaneously), and/or may include receiving each of the DUT wireless signals by the membrane antenna in series (i.e., sequentially). Stated another way, the receiving at 340 may be performed such that probe system 20 distinguishes, or is configured to distinguish, which DUT 42 generates a given DUT wireless signal 48. The generating at 360 may include generating DUT data electric current 49 based upon one or more of the DUT wireless signals 48, and the transmitting at 370 may include conveying the DUT data electric current to signal generation and analysis assembly 70, such as via space transformer 122.

It is within the scope of the present disclosure that the plurality of DUT antennas 46 in the embodiment of FIG. 4 may be arranged and/or distributed in any appropriate manner. As examples, each of the plurality of DUT antennas 46 may be formed on a single DUT 42 or may be formed on a corresponding plurality of DUTs 42. Additionally, membrane antenna 250 may be configured to interface with the plurality of DUT antennas 46 in any appropriate manner. As an example, and as discussed, membrane antenna 250 may be configured to simultaneously receive the corresponding DUT wireless signal 48 from each of the plurality of DUT antennas 46. As another example, and as discussed, membrane antenna 250 may be configured to sequentially receive the corresponding DUT wireless signal 48 from each of the plurality of DUT antennas 46.

Figure 5:
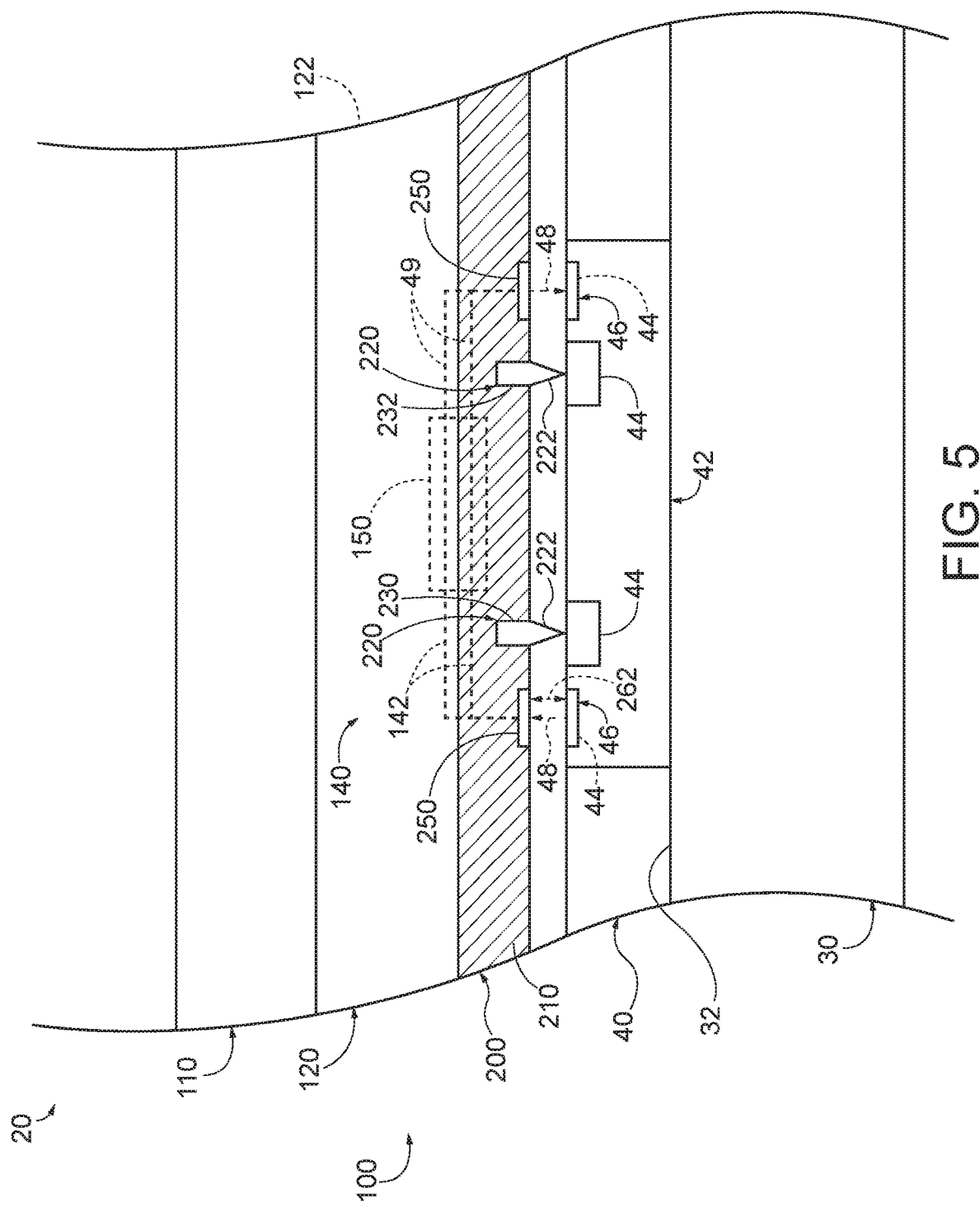
FIG. 5 is a schematic representation of a portion of a probe system, according to the present disclosure, configured for wireless data transfer between a pair of DUT antennas and a pair of membrane antennas.

FIG. 5 illustrates an embodiment of probe system 20, which is configured for wireless data transfer between a plurality of DUT antennas 46 and a corresponding plurality of membrane antennas 250. The embodiment of FIG. 5 is similar to the embodiments of FIGS. 3-4 in that the plurality of probes 220 includes power supply probe 230, which is configured to convey the power supply electric current to DUT 42, and power receipt probe 232, which is configured to convey the power supply current from DUT 42.

However, in the embodiment of FIG. 5, DUT 42 includes a first DUT antenna 46 (e.g., the leftmost DUT antenna) and a second DUT antenna 46 (e.g., the rightmost DUT antenna) that is spaced-apart from the first DUT antenna. Furthermore, in the embodiment of FIG. 5, contact engine 200 includes a first membrane antenna 250 (e.g., the leftmost membrane antenna) configured to receive a corresponding DUT wireless signal 48 from first DUT antenna 46 and a second membrane antenna 250 (e.g., the right most membrane antenna) configured to provide a corresponding DUT wireless signal 48 to second DUT antenna 46. Stated another way, probe head assembly 100 of FIG. 5 may be configured to perform a loop-back test of one or more DUTs 42.

In such an embodiment, probe head assembly 100 further may include a conveyance structure 140, which is configured to convey DUT wireless signal 48 between first membrane antenna 250 and second membrane antenna 250. First DUT antenna 46 and second DUT antenna 46 may be formed on a single DUT 42 or may be formed on two distinct DUTs.

Conveyance structure 140 may take any appropriate form. For example, conveyance structure 140 may include a conveyance electrical conduit 142 that extends between first membrane antenna 250 and second membrane antenna 250. Conveyance electrical conduit 142 may be configured to convey a DUT data electric current 49, which is based upon DUT wireless signal 48, between first membrane antenna 250 and second membrane antenna 250. Additionally or alternatively, conveyance structure 140 may include a dielectric medium that extends between first membrane antenna 250 and second membrane antenna 250 and that is configured to wirelessly transmit DUT wireless signal 48 between the first membrane antenna and the second membrane antenna. As illustrated, conveyance structure 140 may be at least partially, or even completely, defined within any suitable portion and/or component of probe head assembly 100, such as contact engine 200 and/or contact engine support structure 120.

Conveyance structure 140 also may include a signal modifying structure 150, which is configured to modify DUT wireless signal 48. As examples, signal modifying structure 150 may include and/or be an attenuator, a signal delay structure, a balun, a splitter, a combiner, an amplifier, a power amplifier, and/or a lower noise power amplifier.

With reference to the flowchart of FIG. 15, the embodiment of probe system 20 that is schematically illustrated in FIG. 5 may be utilized to perform examples of methods 300. In such a method, the contacting at 310 may include bringing at least power supply probe 230 and power receipt probe 232 into contact with respective contact locations 44 of DUT 42. This may include translating chuck 30 with respect to probe head assembly 100 and/or translating at least a portion of the probe head assembly with respect to the chuck. The providing at 320 may include providing the power supply electric current to one or more DUTs 42. The transmitting at 330 may include generating DUT wireless signal 48 with first DUT antenna 46, and further may include sending the DUT wireless signal with first DUT antenna 46. The receiving at 340 may include receiving DUT wireless signal 48 with first membrane antenna 250. The processing at 350 may include conveying, at 352, DUT wireless signal 48 from first membrane antenna 250 to second membrane antenna 250 via conveyance structure 140, and/or modifying, at 354, DUT wireless signal 48 with signal modifying structure 150. The receiving at 340 may include receiving DUT wireless signal 48 with second membrane antenna 250. Subsequent to the receiving at 340, the transmitting at 330 further may include sending DUT wireless signal 48 with second membrane antenna 250, and the receiving at 340 further may include receiving DUT wireless signal 48 with second DUT antenna 46.

FIG. 6 illustrates an embodiment of probe system 20, which is configured for data transfer to a location spatially removed from DUT 42. In the embodiment of FIG. 6, the plurality of probes 220 includes power supply probe 230, which is configured to convey the power supply electric current to DUT 42, and power receipt probe 232, which is configured to convey the power supply current from DUT 42, as well as a data signal probe 236, which is configured to receive DUT data electric current 49 from DUT 42. Additionally, probe head assembly 100 includes at least one assembly antenna 270, which is configured to receive DUT data electric current 49 from the data signal probe and to generate DUT wireless signal 48 based, at least in part, on DUT data electric current 49.

Assembly antenna 270 may take any appropriate form. As examples, assembly antenna 270 may include membrane antenna 250, a support structure antenna 126 that is supported by contact engine support structure 120, a platen antenna 112 that is supported by platen 110, and/or PCB antenna 132 that is supported by PCB 130. Additionally, assembly antenna 270 may be configured to direct DUT wireless signal 48 in any appropriate direction, such as a direction that is at least substantially parallel to a surface of substrate 40, a direction that is at least substantially perpendicular to the surface of substrate 40, a direction that is at least substantially toward the surface of substrate 40, and/or a direction that is at least substantially away from the surface of substrate 40.

With reference to the flowchart of FIG. 15, the embodiment of probe system 20 that is schematically illustrated in FIG. 6 may be utilized to perform examples of methods 300. In such a method, the contacting at 310 may include bringing at least power supply probe 230, power receipt probe 232, and data signal probe 236 into contact with respective contact locations 44 of DUT 42. This may include translating chuck 30 with respect to probe head assembly 100 and/or translating at least a portion of the probe head assembly with respect to the chuck. The providing at 320 may include providing the power supply electric current to DUT 42. The generating at 360 may include generating DUT data electric current 49 at the contact location 44 corresponding to data signal probe 236, and the transmitting at 370 may include sending the DUT data electric current from the contact location via data signal probe 236. The receiving at 380 may include receiving DUT data electric current 49 with support structure antenna 126, platen antenna 112, and/or PCB antenna 132. Subsequent to the receiving at 380, the transmitting at 330 may include sending DUT wireless signal 48 with the support structure antenna, the platen antenna, and/or the PCB antenna. Subsequent to the transmitting at 330, the receiving at 340 may include receiving the DUT wireless signal with another of support structure antenna 126, platen antenna 112, and/or PCB antenna 132. Hence, support structure antenna 126, platen antenna 112, and/or PCB antenna 132, when present, each may be configured to transmit and/or receive DUT data electric current 49 and/or to wirelessly transmit and/or receive DUT wireless signal 48.

The various embodiments of probe systems 20 illustrated in FIGS. 3-6 and described herein are presented as non-exclusive and non-mutually-exclusive examples of probe systems 20 according to the present disclosure. Thus, elements, features, and/or corresponding methods associated with more than one of FIGS. 3-6 may be utilized in probe system 20. As an example, probe system 20 may include data signal probe 236 as in the embodiment of FIG. 6 as well as conveyance structure 140 and/or signal modifying structure 150 as in the embodiment of FIG. 5. As another example, probe system 20 may include DUT antenna 46 configured to transmit DUT wireless signal 48 as in the embodiment of FIG. 3 as well as one or more of support structure antenna 126, platen antenna 112, and PCB antenna 132 as in the embodiment of FIG. 6.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

Examples of contact engines, probe head assemblies, probe systems, and methods according to the present disclosure are presented in the following enumerated paragraphs.

A1. A contact engine for testing a device under test (DUT), the contact engine comprising:

a flexible dielectric membrane having a first surface and an opposed second surface;

a plurality of probes supported by the flexible dielectric membrane and oriented, relative to one another, to contact a plurality of contact locations on the DUT, wherein each probe in the plurality of probes includes a corresponding probe tip that projects from the second surface of the flexible dielectric membrane and is configured to electrically and physically contact a corresponding contact location of the plurality of contact locations; and optionally a membrane antenna supported by the flexible dielectric membrane.

A2. The contact engine of paragraph A1, wherein at least one probe in the plurality of probes is a power supply probe configured to convey a power supply electric current to the DUT.

A3. The contact engine of any of paragraphs A1-A2, wherein at least one probe in the plurality of probes is a power receipt probe configured to receive a/the power supply electric current from the DUT.

A4. The contact engine of any of paragraphs A1-A3, wherein at least one probe in the plurality of probes is a membrane antenna-connected probe configured to electrically interconnect the membrane antenna and the DUT to permit excitation of the membrane antenna by the DUT.

A5. The contact engine of any of paragraphs A1-A4, wherein the plurality of probes includes a plurality of rocking beam probes.

A6. The contact engine of paragraph A5, wherein each rocking beam probe in the plurality of rocking beam probes includes a probe beam including an elongate beam axis, which extends at least substantially parallel to the second surface of the flexible dielectric membrane, and further wherein the corresponding probe tip of each rocking beam probe extends from a probe tip side the probe beam.

A7. The contact engine of paragraph A6, wherein each rocking beam probe further includes a beam post, which extends from a beam post side of the probe beam.

A8. The contact engine of paragraph A7, wherein the probe tip extends from the probe beam in a probe extension direction, and further wherein the beam post extends from the probe beam in a beam post extension direction that is at least substantially opposed to the probe extension direction.

A9. The contact engine of any of paragraphs A7-A8, wherein at least a portion of the beam post at least one of:

(i) projects from the first surface of the flexible dielectric membrane;

(ii) is flush with the first surface of the flexible dielectric membrane; and (iii) is exposed on the first surface of the flexible dielectric membrane.

A10. The contact engine of any of paragraphs A1-A9, wherein the membrane antenna includes at least one of:

(i) a thin-film membrane antenna; and (ii) a lithographically defined membrane antenna.

A11. The contact engine of any of paragraphs A1-A10, wherein the membrane antenna includes, and optionally is, at least one of:

(i) a linear dipole membrane antenna;

(ii) a fractal membrane antenna;

(iii) a spiral membrane antenna;

(iv) a loop dipole membrane antenna;

(v) a loop monopole membrane antenna;

(vi) a hybrid loop-bar monopole membrane antenna;

(vii) a slot membrane antenna; and (viii) a bowtie membrane antenna.

A12. The contact engine of any of paragraphs A1-A11, wherein the membrane antenna is configured to convey a wireless signal, which has a wireless signal wavelength, and further wherein the membrane antenna defines a membrane antenna length that is at least one of one-half, one-fourth, one-tenth, one-twentieth, one-fiftieth, and one-one hundredth of the wireless signal wavelength.

A13. The contact engine of any of paragraphs A1-A12, wherein the membrane antenna has a characteristic linear dimension that is at least one of a diameter, an effective diameter, and a maximum length, and wherein the characteristic linear dimension is at least one of at least 50 micrometers (μm), at least 100 μm, at least 200 μm, at least 500 μm, at least 1000 μm, at least 1500 μm, at most 2000 μm, at most 1700 μm, at most 1300 μm, at most 700 μm, at most 300 μm, and at most 100 μm.

A14. The contact engine of any of paragraphs A1-A13, wherein the flexible dielectric membrane further includes at least one tuning structure configured to tune, or selectively vary, a resonant frequency of the membrane antenna.

A15. The contact engine of paragraph A14, wherein the tuning structure includes at least one of:

(i) a tuning capacitor; and (ii) a tuning inductor.

A16. The contact engine of any of paragraphs A1-A15, wherein the contact engine further includes a plurality of probe-connected electrical traces supported by the flexible dielectric membrane, wherein each of the plurality of probe-connected electrical traces is in electrical communication with a corresponding one of the plurality of probes.

A17. The contact engine of any of paragraphs A1-A16, wherein the membrane antenna is a first membrane antenna, and further wherein the contact engine includes a plurality of membrane antenna supported by the flexible dielectric membrane.

A18. The contact engine of paragraph A17, wherein the contact engine further includes a data signal conductor, a plurality of membrane antenna conductors, and a switching matrix, wherein the data signal conductor is in electrical communication with the switching matrix, wherein each of the plurality of membrane antenna conductors provides electrical communication between the switching matrix and a corresponding one of the plurality of membrane antennas, and further wherein the switching matrix is configured to selectively interconnect the data signal conductor with each of the plurality of membrane antenna conductors.

A19. The contact engine of any of paragraphs A1-A18, wherein the flexible dielectric membrane includes, and optionally is, a polyimide membrane.

B1. A probe head assembly, comprising:
a platen;
a contact engine support structure operatively attached to the platen; and
the contact engine of any of paragraphs A1-A19, wherein the flexible dielectric membrane is mechanically supported by the contact engine support structure, wherein the first surface of the flexible dielectric membrane faces toward, and optionally contacts, the contact engine support structure, and further wherein the second surface of the flexible dielectric membrane faces away from the contact engine support structure.

B2. The probe head assembly of paragraph B1, wherein the contact engine support structure includes an electrically insulating, or a dielectric, material.

B3. The probe head assembly of any of paragraphs B1-B2, wherein the contact engine support structure includes, and optionally is, a space transformer configured to at least one of:
(i) provide a plurality of electric signals to the plurality of probes; and
(ii) receive a plurality of electric signals from the plurality of probes.

B4. The probe head assembly of paragraph B3, wherein the space transformer includes a plurality of space transformer contact pads, and further wherein at least a subset of the plurality of probes electrically contacts a corresponding one of the plurality of space transformer contact pads.

B5. The probe head assembly of any of paragraphs B1-B4, wherein the probe head assembly further includes a printed circuit board (PCB), wherein the printed circuit board is in electrical communication with at least a subset of the plurality of probes.

B6. The probe head assembly of paragraph B5, wherein the PCB includes a PCB antenna.

B7. The probe head assembly of paragraph B6, wherein the probe head assembly further includes a PCB antenna conductor that provides electrical communication between the PCB antenna and a corresponding one of the plurality of probes.

C1. A probe system, comprising:
a chuck defining a support surface configured to support a substrate that includes a plurality of devices under test (DUTs);
the probe head assembly of any of paragraphs B1-B7, wherein the second surface of the flexible dielectric membrane faces toward the support surface; and
a translation structure configured to selectively and electrically contact the plurality of probes with a corresponding plurality of contact locations on the DUT.

C2. The probe system of paragraph C1, wherein the probe system further includes an enclosure that defines an enclosed volume, wherein the support surface extends within the enclosed volume.

C3. The probe system of any of paragraphs C1-C2, wherein the probe system further includes a signal generation and analysis assembly configured to at least one of:
(i) provide at least one test signal electric current to a selected probe of the plurality of probes;
(ii) receive at least one resultant signal electric current from the selected probe;
(iii) provide at least one power supply electric current to the selected probe; and
(iv) receive at least one power supply electric current from the selected probe.

C4. The probe system of any of paragraphs C1-C3, wherein the probe system includes the substrate.

C5. The probe system of paragraph C4, wherein at least one of:
(i) the DUT includes a plurality of contact pads, and further wherein the plurality of probe tips is in electrical contact with the plurality of contact pads; and
(ii) the DUT includes a plurality of solder balls, and further wherein the plurality of probe tips is in electrical contact with the plurality of solder balls.

C6. The probe system of any of paragraphs C4-C5, wherein the DUT includes a DUT antenna, wherein the membrane antenna is in wireless communication with the DUT antenna, and wherein the membrane antenna is configured to receive a DUT wireless signal from the DUT antenna.

C7. The probe system of paragraph C6, wherein the DUT antenna is configured for wireless communication.

C8. The probe system of any of paragraphs C6-C7, wherein the DUT antenna includes, and optionally is, at least one of:
(i) a linear dipole DUT antenna;
(ii) a fractal DUT antenna;
(iii) a spiral DUT antenna;
(iv) a loop dipole DUT antenna;
(v) a loop monopole DUT antenna;
(vi) a hybrid loop-bar monopole DUT antenna;
(vii) a slot DUT antenna; and
(viii) a bowtie DUT antenna.

C9. The probe system of any of paragraphs C6-C8, wherein the DUT antenna is configured for electrical communication via physical contact.

C10. The probe system of any of paragraphs C6-C9, wherein the DUT antenna includes at least one of a contact pad, a solder ball, and a contact location of the plurality of contact locations.

C11. The probe system of paragraph C6, wherein the membrane antenna is configured for near-field communication with the DUT antenna.

C12. The probe system of any of paragraphs C6-C11, wherein the membrane antenna is spaced-apart from the DUT.

C13. The probe system of paragraph C12, wherein a distance between the membrane antenna and the DUT is at least one of:
(i) at least 10 micrometers, at least 20 micrometers; at least 30 micrometers, at least 40 micrometers, at least 50 micrometers, at least 75 micrometers, or at least 100 micrometers; and (ii) at most 500 micrometers, at most 400 micrometers, at most 300 micrometers, at most 200 micrometers, at most 150 micrometers, at most 100 micrometers, or at most 75 micrometers.

C14. The probe system of any of paragraphs C12-C13, wherein a minimum distance between the DUT and the membrane antenna is defined by the probe tip.

C15. The probe system of any of paragraphs C6-C14, wherein the membrane antenna is configured to wirelessly communicate with a single DUT antenna.

C16. The probe system of any of paragraphs C6-C15, wherein the membrane antenna is configured to wirelessly communicate with each of at least one of at least two DUT antennas, at least three DUT antennas, at least five DUT antennas, at least 10 DUT antennas and at least 20 DUT antennas.

C17. The probe system of any of paragraphs C1-C16, wherein:

(i) the plurality of probes includes a/the power supply probe, which is configured to convey a/the power supply electric current to the DUT, and a/the power receipt probe, which is configured to receive the power supply electric current from the DUT;

(ii) the DUT includes a/the DUT antenna; and (iii) the membrane antenna is configured to receive a/the DUT wireless signal from the DUT antenna.

C18. The probe system of paragraph C17, wherein the probe head assembly further is configured to generate a DUT data electric current, which is based upon the DUT wireless signal, and to convey the DUT data electric current to a/the signal generation and analysis assembly.

C19. The probe system of any of paragraphs C1-C18, wherein:

(i) the plurality of probes includes a/the power supply probe, which is configured to convey a/the power supply electric current to the DUT, and a/the power receipt probe, which is configured to receive the power supply electric current from the DUT;

(ii) the substrate includes a plurality of DUT antennas; and (iii) the membrane antenna is configured to receive a corresponding DUT wireless signal from each of the plurality of DUT antennas.

C20. The probe system of paragraph C19, wherein the probe head assembly further is configured to generate a DUT data electric current, which is based upon the corresponding DUT wireless signals, and to convey the DUT data electric current to a/the signal generation and analysis assembly.

C21. The probe system of any of paragraphs C19-C20, wherein the membrane antenna is within a threshold distance of each of the plurality of DUT antennas.

C22. The probe system of paragraph C21, wherein the threshold distance is at least one of:

(i) at least 10 micrometers, at least 20 micrometers; at least 30 micrometers, at least 40 micrometers, at least 50 micrometers, at least 75 micrometers, or at least 100 micrometers; and (ii) at most 500 micrometers, at most 400 micrometers, at most 300 micrometers, at most 200 micrometers, at most 150 micrometers, at most 100 micrometers, or at most 75 micrometers.

C23. The probe system of any of paragraphs C19-C22, wherein each of the plurality of DUT antennas is formed on a single DUT.

C24. The probe system of any of paragraphs C19-C22, wherein the plurality of DUT antennas is formed on a corresponding plurality of DUTs.

C25. The probe system of any of paragraphs C19-C24, wherein the membrane antenna is configured to at least one of:

(i) simultaneously receive the corresponding DUT wireless signal from each of the plurality of DUT antennas; and (ii) sequentially receive the corresponding DUT wireless signal from each of the plurality of DUT antennas.

C26. The probe system of any of paragraphs C1-C25, wherein:

(i) the plurality of probes includes a/the power supply probe, which is configured to convey a/the power supply electric current to the DUT, and a/the power receipt probe, which is configured to receive the power supply electric current from the DUT;

(ii) the substrate includes a first DUT antenna and a second DUT antenna that is spaced-apart from the first DUT antenna;

(iii) the membrane antenna is a first membrane antenna, which is configured to receive the DUT wireless signal from the first DUT antenna;

(iv) the contact engine further includes a second membrane antenna;

(v) the probe head assembly further includes a conveyance structure, which is configured to convey the DUT wireless signal from the first membrane antenna to the second membrane antenna; and (vi) the second membrane antenna is configured to provide the DUT wireless signal to the second DUT antenna.

C27. The probe system of paragraph C26, wherein the first DUT antenna and the second DUT antenna at least one of:

(i) are formed on a single DUT; and (ii) are formed on two distinct DUTs.

C28. The probe system of any of paragraphs C26-C27, wherein the conveyance structure includes a conveyance electrical conduit that extends between the first membrane antenna and the second membrane antenna and is configured to convey a DUT data electric current, which is based upon the DUT wireless signal, between the first membrane antenna and the second membrane antenna.

C29. The probe system of any of paragraphs C26-C28, wherein the conveyance structure includes a dielectric medium that extends between the first membrane antenna and the second membrane antenna and is configured to wirelessly transmit the DUT wireless signal therebetween.

C30. The probe system of any of paragraphs C26-C29, wherein the conveyance structure further includes a signal modifying structure configured to modify the DUT wireless signal, optionally wherein the conveyance structure includes at least one of:

(i) an attenuator;

(ii) a signal delay structure;

(iii) a balun;

(iv) a splitter;

(v) a combiner;

(vi) an amplifier;

(vii) a power amplifier; and (viii) a low noise power amplifier.

C31. The probe system of any of paragraphs C1-C30, wherein:

(i) the plurality of probes includes a/the power supply probe, which is configured to convey a/the power supply electric current to the DUT, a/the power receipt probe, which is configured to receive the power supply electric current from the DUT, and a data signal probe, which is configured to receive a/the DUT data electric current from the DUT; and (ii) the probe head assembly includes an assembly antenna configured to receive the DUT data electric current from the data signal probe and to generate a/the DUT wireless signal based, at least in part, on the DUT data electric current.

C32. The probe system of paragraph C31, wherein the assembly antenna includes at least one of:
(i) a/the membrane antenna that is supported by the flexible dielectric membrane;
(ii) a support structure antenna that is supported by the contact engine support structure;
(iii) a platen antenna that is supported by the platen; and
(iv) a PCB antenna that is supported by a/the PCB.

C33. The probe system of any of paragraphs C31-C32, wherein the assembly antenna is configured to direct the DUT wireless signal in a direction that is at least one of:
(i) at least substantially parallel to a surface of the substrate;
(ii) at least substantially perpendicular to the surface of the substrate;
(iii) at least substantially toward the surface of the substrate; and
(iv) at least substantially away from the surface of the substrate.

D1. A method of operating a probe system to test a device under test (DUT), the method comprising:
contacting at least one DUT with a corresponding at least one probe of the probe system of any of paragraphs C1-C33;
providing a power supply electric current to the at least one DUT via the at least one probe;
transmitting at least one DUT wireless signal; and
transmitting a DUT data electric current.

D2. The method of paragraph D1, wherein the contacting includes bringing a power supply probe and a power receipt probe into contact with respective contact locations of the DUT.

D3. The method of any of paragraphs D1-D2, wherein the contacting includes bringing a/the data signal probe into contact with a respective contact location of the DUT.

D4. The method of any of paragraphs D1-D3, wherein the contacting includes translating the chuck with respect to the probe head assembly.

D5. The method of any of paragraphs D1-D4, wherein the contacting includes translating at least a portion of the probe head assembly with respect to the chuck.

D6. The method of any of paragraphs D1-D5, wherein the providing the power supply electric current includes providing the power supply electric current to the DUT via a/the power supply probe.

D7. The method of any of paragraphs D1-D6, wherein the transmitting the at least one DUT wireless signal includes generating at least one DUT wireless signal with each of a corresponding at least one DUT antenna responsive to receipt of the power supply electric current.

D8. The method of any of paragraphs D1-D7, wherein the transmitting the at least one DUT wireless signal includes transmitting from at least one of a/the DUT antenna and a/the membrane antenna.

D9. The method of any of paragraphs D1-D8, wherein the transmitting the at least one DUT wireless signal includes transmitting from a first membrane antenna to a second membrane antenna.

D10. The method of any of paragraphs D1-D9, wherein the method further includes, subsequent to the transmitting the at least one DUT wireless signal, receiving the at least one DUT wireless signal.

D11. The method of paragraph D10, wherein the receiving the at least one DUT wireless signal includes receiving with at least one of a/the DUT antenna and a/the membrane antenna.

D12. The method of paragraph D11, wherein the receiving the at least one DUT wireless signal includes receiving a plurality of DUT wireless signals with a single membrane antenna.

D13. The method of paragraph D12, wherein the receiving includes receiving the plurality of DUT wireless signals in parallel.

D14. The method of any of paragraphs D12-D13, wherein the receiving includes receiving the plurality of DUT wireless signals sequentially.

D15. The method of any of paragraphs D1-D14, wherein the method further includes processing the at least one DUT wireless signal.

D16. The method of paragraph D15, wherein the processing includes at least one of conveying the at least one DUT wireless signal and modifying the at least one DUT wireless signal with a signal modifying structure.

D17. The method of any of paragraphs D1-D16, wherein the method further includes, prior to the transmitting the DUT data electric current, generating the DUT data electric current.

D18. The method of paragraph D17, wherein the generating the DUT data electric current includes generating based upon the DUT wireless signal.

D19. The method of any of paragraphs D17-D18, wherein the generating the DUT data electric current includes generating with at least one of a/the membrane antenna and a/the DUT antenna.

D20. The method of any of paragraphs D17-D19, wherein the generating the DUT data electric current includes generating at a contact location corresponding to a/the data signal probe.

D21. The method of any of paragraphs D1-D20, wherein the transmitting the DUT data electric current includes conveying the DUT data electric current to a/the signal generation and analysis assembly.

D22. The method of any of paragraphs D1-D21, wherein the transmitting the DUT data electric current includes conveying the DUT data electric current via a/the space transformer.

D23. The method of any of paragraphs D1-D22, wherein the transmitting the DUT data electric current includes conveying the DUT data electric current via a/the data signal probe.

D24. The method of any of paragraphs D1-D23, wherein the transmitting the DUT data electric current includes transmitting with at least one of a/the support structure antenna, a/the platen antenna, and a/the PCB antenna.

D25. The method of any of paragraphs D1-D24, wherein the method further includes, subsequent to the transmitting the DUT data electric current, receiving the DUT data electric current.

D26. The method of paragraph D25, wherein the receiving the DUT data electric current includes receiving with at least one of a/the support structure antenna, a/the platen antenna, and a/the PCB antenna.

D27. The method of any of paragraphs D25-D26, wherein the method further includes, subsequent to the receiving the DUT data electric current, repeating the transmitting the DUT data electric current.

INDUSTRIAL APPLICABILITY

The contact engines, probe head assemblies, probe systems, and methods disclosed herein are applicable to the electronic device manufacturing, assembly, and/or test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A contact engine for testing a device under test (DUT), the contact engine comprising:
   a flexible dielectric membrane having a first surface and an opposed second surface;
   a plurality of probes supported by the flexible dielectric membrane and oriented, relative to one another, to contact a plurality of contact locations on the DUT, wherein each probe in the plurality of probes includes a corresponding probe tip that projects from the second surface of the flexible dielectric membrane and is configured to electrically and physically contact a corresponding contact location of the plurality of contact locations; and
   at least one membrane antenna supported by the flexible dielectric membrane;
   wherein at least one probe in the plurality of probes is a membrane antenna-connected probe configured to electrically interconnect the membrane antenna and the DUT to permit excitation of the membrane antenna by the DUT.

2. The contact engine of claim 1, wherein at least one probe in the plurality of probes is a power supply probe configured to convey a power supply electric current to the DUT, and wherein at least one other probe in the plurality of probes is a power receipt probe configured to receive the power supply electric current from the DUT.

3. The contact engine of claim 1, wherein the membrane antenna is configured to convey a wireless signal, which has a wireless signal wavelength, and further wherein the membrane antenna defines a membrane antenna length that is at least substantially equal to at least one of one-half of the wireless signal wavelength, one-fourth of the wireless signal wavelength, one-tenth of the wireless signal wavelength, one-twentieth of the wireless signal wavelength, one-fiftieth of the wireless signal wavelength, and one-one hundredth of the wireless signal wavelength.

4. The contact engine of claim 1, wherein the contact engine further includes a plurality of probe-connected electrical traces supported by the flexible dielectric membrane, wherein each of the plurality of probe-connected electrical traces is in electrical communication with a corresponding one of the plurality of probes.

5. The contact engine of claim 1, wherein the contact engine includes a plurality of membrane antennas; wherein the contact engine further includes a data signal conductor, a plurality of membrane antenna conductors, and a switching matrix; wherein the data signal conductor is in electrical communication with the switching matrix; wherein each of the plurality of membrane antenna conductors provides electrical communication between the switching matrix and a corresponding one of the plurality of membrane antennas; and further wherein the switching matrix is configured to selectively interconnect the data signal conductor with each of the plurality of membrane antenna conductors.

6. A probe head assembly, comprising:
   a platen;
   a contact engine support structure operatively attached to the platen; and
   the contact engine of claim 1;
   wherein the flexible dielectric membrane is mechanically supported by the contact engine support structure, wherein the first surface of the flexible dielectric membrane faces toward the contact engine support structure, and further wherein the second surface of the flexible dielectric membrane faces away from the contact engine support structure.

7. The probe head assembly of claim 6, wherein the contact engine support structure includes a space transformer configured to at least one of:
   (i) provide a plurality of electric signals to the plurality of probes; and
   (ii) receive a plurality of electric signals from the plurality of probes.

8. The probe head assembly of claim 7, wherein the space transformer includes a plurality of space transformer contact pads, and further wherein at least a subset of the plurality of probes electrically contacts a corresponding one of the plurality of space transformer contact pads.

9. A probe system, comprising:
   a substrate that includes a plurality of devices under test (DUTs);
   a chuck defining a support surface configured to support the substrate;
   the probe head assembly of claim 6, wherein the second surface of the flexible dielectric membrane faces toward the support surface; and
   a translation structure configured to selectively and electrically contact the plurality of probes with a corresponding plurality of contact locations on the DUT.

10. The probe system of claim 9, wherein the probe system further includes a signal generation and analysis assembly configured to at least one of:
   (i) provide at least one test signal electric current to a selected probe of the plurality of probes;

(ii) receive at least one resultant signal electric current from the selected probe;
(iii) provide at least one power supply electric current to the selected probe; and
(iv) receive at least one power supply electric current from the selected probe.

11. The probe system of claim 9, wherein the DUT includes a DUT antenna, wherein the membrane antenna is in wireless communication with the DUT antenna, and wherein the membrane antenna is configured to receive a DUT wireless signal from the DUT antenna.

12. The probe system of claim 11, wherein the DUT antenna is configured for wireless communication.

13. The probe system of claim 11, wherein the DUT antenna includes at least one of a contact pad, a solder ball, and a contact location of the plurality of contact locations.

14. The probe system of claim 11, wherein the membrane antenna is configured for near-field communication with the DUT antenna.

15. The probe system of claim 11, wherein the membrane antenna is a single membrane antenna configured to wirelessly communicate with at least two DUT antennas.

16. The probe system of claim 9, wherein:
(i) the plurality of probes includes a power supply probe, which is configured to convey a power supply electric current to the DUT, and a power receipt probe, which is configured to receive the power supply electric current from the DUT;
(ii) the substrate includes a plurality of DUT antennas; and
(iii) the membrane antenna is a single membrane antenna configured to receive a corresponding DUT wireless signal from each of the plurality of DUT antennas.

17. The probe system of claim 9, wherein:
(i) the plurality of probes includes a power supply probe, which is configured to convey a power supply electric current to the DUT, and a power receipt probe, which is configured to receive the power supply electric current from the DUT;
(ii) the substrate includes a first DUT antenna and a second DUT antenna that is spaced-apart from the first DUT antenna;
(iii) the membrane antenna is a first membrane antenna, which is configured to receive the DUT wireless signal from the first DUT antenna;
(iv) the contact engine further includes a second membrane antenna;
(v) the probe head assembly further includes a conveyance structure, which is configured to convey the DUT wireless signal from the first membrane antenna to the second membrane antenna; and
(vi) the second membrane antenna is configured to provide the DUT wireless signal to the second DUT antenna.

18. The probe system of claim 17, wherein the conveyance structure further includes a signal modifying structure configured to modify the DUT wireless signal, and wherein the conveyance structure includes at least one of:
(i) an attenuator;
(ii) a signal delay structure;
(iii) a balun;
(iv) a splitter;
(v) a combiner;
(vi) an amplifier;
(vii) a power amplifier; and
(viii) a low noise power amplifier.

19. A method of operating a probe system to test a device under test (DUT), the method comprising:
contacting at least one DUT with a corresponding at least one probe of the probe system of claim 9;
providing a power supply electric current to the at least one DUT via the at least one probe;
transmitting at least one DUT wireless signal; and
transmitting a DUT data electric current.

20. The method of claim 19, wherein the contacting includes bringing a power supply probe and a power receipt probe into contact with respective contact locations of the DUT, wherein the providing the power supply electric current includes providing the power supply electric current to the DUT via the power supply probe.

21. The method of claim 19, wherein the transmitting the at least one DUT wireless signal includes generating at least one DUT wireless signal with each of a corresponding at least one DUT antenna responsive to receipt of the power supply electric current.

22. The method of claim 19, wherein the transmitting the at least one DUT wireless signal includes transmitting from at least one of a DUT antenna and the at least one membrane antenna.

23. The method of claim 19, wherein, subsequent to the transmitting the at least one DUT wireless signal, the method further includes receiving the at least one DUT wireless signal with at least one of a DUT antenna and the at least one membrane antenna.

24. The method of claim 23, wherein the receiving the at least one DUT wireless signal includes receiving a plurality of DUT wireless signals from a plurality of DUT antennas with a single membrane antenna.

25. The method of claim 19, wherein, prior to the transmitting the DUT data electric current, the method further includes generating the DUT data electric current based upon the DUT wireless signal.

26. A probe system, comprising:
a substrate that includes a device under test (DUT);
a chuck defining a support surface configured to support the substrate;
a probe head assembly including:
(i) a platen;
(ii) a contact engine support structure operatively attached to the platen; and
(iii) a contact engine, wherein the contact engine includes:
(a) a flexible dielectric membrane having a first surface and an opposed second surface;
(b) a plurality of probes supported by the flexible dielectric membrane and oriented, relative to one another, to contact a plurality of contact locations on the DUT, wherein each probe in the plurality of probes includes a corresponding probe tip that projects from the second surface of the flexible dielectric membrane and is configured to electrically and physically contact a corresponding contact location of the plurality of contact locations; and
(c) at least one membrane antenna supported by the flexible dielectric membrane; and
a translation structure configured to selectively and electrically contact the plurality of probes with a corresponding plurality of contact locations on the DUT;
wherein:
(i) the flexible dielectric membrane is mechanically supported by the contact engine support structure;
(ii) the first surface of the flexible dielectric membrane faces toward the contact engine support structure;

(iii) the second surface of the flexible dielectric membrane faces away from the contact engine support structure;
(iv) the second surface of the flexible dielectric membrane faces toward the support surface;
(v) the plurality of probes includes a power supply probe, which is configured to convey a power supply electric current to the DUT, and a power receipt probe, which is configured to receive the power supply electric current from the DUT;
(vi) the substrate includes a first DUT antenna and a second DUT antenna that is spaced-apart from the first DUT antenna;
(vii) the membrane antenna is a first membrane antenna, which is configured to receive a DUT wireless signal from the first DUT antenna;
(viii) the contact engine further includes a second membrane antenna;
(ix) the probe head assembly further includes a conveyance structure, which is configured to convey the DUT wireless signal from the first membrane antenna to the second membrane antenna; and
(x) the second membrane antenna is configured to provide the DUT wireless signal to the second DUT antenna.

27. The probe system of claim 26, wherein the contact engine further includes a plurality of probe-connected electrical traces supported by the flexible dielectric membrane, wherein each of the plurality of probe-connected electrical traces is in electrical communication with a corresponding one of the plurality of probes.

28. The probe system of claim 26, wherein the contact engine support structure includes a space transformer configured to at least one of:
(i) provide a plurality of electric signals to the plurality of probes; and
(ii) receive a plurality of electric signals from the plurality of probes.

29. The probe system of claim 26, wherein the probe system further includes a signal generation and analysis assembly configured to at least one of:
(i) provide at least one test signal electric current to a selected probe of the plurality of probes;
(ii) receive at least one resultant signal electric current from the selected probe;
(iii) provide at least one power supply electric current to the selected probe; and
(iv) receive at least one power supply electric current from the selected probe.

30. The probe system of claim 26, wherein the conveyance structure further includes a signal modifying structure configured to modify the DUT wireless signal, and wherein the conveyance structure includes at least one of:
(i) an attenuator;
(ii) a signal delay structure;
(iii) a balun;
(iv) a splitter;
(v) a combiner;
(vi) an amplifier;
(vii) a power amplifier; and
(viii) a low noise power amplifier.

31. A method of operating a probe system to test a device under test (DUT), the method comprising:
contacting at least one DUT with a corresponding at least one probe of the probe system of claim 26;
providing a power supply electric current to the at least one DUT via the at least one probe;
transmitting at least one DUT wireless signal; and
transmitting a DUT data electric current.

* * * * *